(12) United States Patent
Tsuchiya et al.

(10) Patent No.: US 10,877,102 B2
(45) Date of Patent: Dec. 29, 2020

(54) VOLTAGE DETECTION DEVICE

(71) Applicant: KEIHIN CORPORATION, Tokyo (JP)

(72) Inventors: Shingo Tsuchiya, Utsunomiya (JP);
Seiji Kamata, Utsunomiya (JP);
Atsushi Hirokawa, Haga-gun (JP);
Seigo Imai, Shioya-gun (JP)

(73) Assignee: KEIHIN CORPORATION, Tokyo (JP)

( * ) Notice: Subject to any disclaimer, the term of this patent is extended or adjusted under 35 U.S.C. 154(b) by 31 days.

(21) Appl. No.: 16/275,875

(22) Filed: Feb. 14, 2019

(65) Prior Publication Data

US 2019/0293725 A1 Sep. 26, 2019

(30) Foreign Application Priority Data

Mar. 26, 2018 (JP) ................. 2018-058301

(51) Int. Cl.
*G01R 31/3835* (2019.01)
*G01R 31/36* (2020.01)
*H02H 3/20* (2006.01)
*H02H 1/00* (2006.01)
*H02J 7/00* (2006.01)

(52) U.S. Cl.
CPC ..... *G01R 31/3835* (2019.01); *G01R 31/3644* (2013.01); *H02H 1/0007* (2013.01); *H02H 3/20* (2013.01); *H02J 7/0031* (2013.01)

(58) Field of Classification Search
CPC .......... G01R 33/288; A61B 2560/0266; A61B 5/0033; A61B 2562/0223
USPC ................................. 324/300, 263, 301, 434
See application file for complete search history.

(56) References Cited

U.S. PATENT DOCUMENTS

| 6,617,972 B2* | 9/2003 | Takarada | G08B 21/0484 340/635 |
| 6,679,101 B1* | 1/2004 | Rohner | B01D 65/102 200/61.04 |
| 8,779,729 B2* | 7/2014 | Shiraishi | G06F 1/3212 320/155 |
| 2010/0241094 A1* | 9/2010 | Sherron | A61F 13/42 604/361 |
| 2010/0267161 A1* | 10/2010 | Wu | C12C 1/001 436/149 |
| 2012/0098518 A1* | 4/2012 | Unagami | G01R 22/066 324/74 |

FOREIGN PATENT DOCUMENTS

JP 2015136256 A 7/2015

* cited by examiner

*Primary Examiner* — Giovanni Astacio-Oquendo
(74) *Attorney, Agent, or Firm* — Cantor Colburn LLP

(57) ABSTRACT

A voltage detection device is provided which includes: a plurality of wires that are connected to a plurality of battery cells of a battery; a voltage detection circuit that operates with supply of electric power from the battery and detects voltages of the plurality of battery cells via the plurality of wires; an overvoltage protection circuit that electrically connects one or more wires of the plurality of wires to a minus terminal of the battery when the voltage of the one or more wires is higher than a predetermined threshold value; and a breaker circuit that irreversibly breaks electrical connection between the minus terminal and the voltage detection circuit using a current flowing from the one or more wires to the minus terminal.

5 Claims, 5 Drawing Sheets

VOLTAGE DETECTION DEVICE

CROSS-REFERENCE TO RELATED APPLICATION

The present invention claims priority under 35 U.S.C. § 119 to Japanese Patent Application No. 2018-058301, filed on Mar. 26, 2018, the entire contents of which are incorporated herein by reference.

BACKGROUND OF THE INVENTION

Field of the Invention

The present invention relates to a voltage detection device.

Description of Related Art

A voltage detection device described in Patent Document 1 includes a voltage detection circuit, a plurality of voltage detection lines, a discharge circuit, and a power adjusting unit. The voltage detection circuit detects voltages of a plurality of battery cells constituting a battery. The plurality of voltage detection lines connect the battery cells to the voltage detection circuit. The discharge circuit connects the voltage detection lines to the ground and discharges the battery in an overcharged state. The power adjusting unit adjusts power from the battery and supplies the adjusted power as driving power to the voltage detection circuit. The voltage detection circuit detects the voltages of the battery cells via the voltage detection lines. The voltage detection circuit includes an overvoltage protection circuit that protects the voltage detection circuit from a voltage which is equal to or higher than a predetermined threshold value and which is generated in the voltage detection lines, the discharge circuit, and the power adjusting unit.

PATENT DOCUMENTS

[Patent Document 1] Japanese Unexamined Patent Application, First Publication No. 2015-136256

SUMMARY OF THE INVENTION

However, with the above-mentioned voltage detection device according to the related art, it is possible to protect the voltage detection circuit from an overvoltage but it is not possible to stop operation of the voltage detection circuit when an overvoltage is generated.

An objective of an embodiment of the invention is to reliably stop operation of a voltage detection circuit when an overvoltage is generated.

(1) According to an embodiment of the invention, there is provided a voltage detection device including: a plurality of wires that are connected to a plurality of battery cells of a battery; a voltage detection circuit that operates with supply of electric power from the battery and detects voltages of the plurality of battery cells via the plurality of wires; an overvoltage protection circuit that electrically connects one or more wires of the plurality of wires to a minus terminal of the battery when the voltage of the one or more wires is higher than a predetermined threshold value; and a breaker circuit that irreversibly breaks electrical connection between the minus terminal and the voltage detection circuit using a current flowing from the one or more wires to the minus terminal.

(2) In the voltage detection device according to (1), the breaker circuit may be a fuse having a first end connected to the minus terminal and a second end connected to the voltage detection circuit and the ground. In the voltage detection device according to (2), the overvoltage protection circuit may electrically connect the one or more wires to the minus terminal via the breaker circuit by electrically connecting the one or more wires to the ground when the voltage of the one or more wires is higher than the predetermined threshold value.

(3) The voltage detection device according to (1) may further include a power adjusting unit that adjusts electric power of the battery and supplies the adjusted electric power as driving power to the voltage detection circuit. In the voltage detection device according to (3), the overvoltage protection circuit may include: a Zener diode in which a current flows when a voltage equal to or higher than the predetermined threshold value is applied thereto; a switching element that includes three terminals and in which a first terminal serving as a control terminal among the three terminals is connected to an anode terminal of the Zener diode, a second terminal among the other two terminals is connected to a cathode terminal of the Zener diode, and a third terminal is connected to the ground; a resistor having a first end connected to the anode terminal of the Zener diode and a second end connected to the ground; a plurality of first diodes having anode terminals electrically connected to the wires connected to a plurality of battery cells in which at least a voltage of a plus terminal of the corresponding battery cell is equal to or higher than a predetermined value among the plurality of battery cells and cathode terminals electrically connected to the cathode terminal of the Zener diode; and a second diode having an anode terminal connected to the power adjusting unit and a cathode terminal connected to the cathode terminal of the Zener diode. The breaker circuit may be a fuse having a first end connected to the minus terminal and a second end connected to the voltage detection circuit and the ground.

(4) The voltage detection device according to (1) may further include a power adjusting unit that adjusts electric power of the battery and supplies the adjusted electric power as driving power to the voltage detection circuit. In the voltage detection device according to (4), the overvoltage protection circuit may include: a Zener diode having an anode terminal connected to the ground and in which a current flows when a voltage equal to or higher than the predetermined threshold value is applied thereto; a plurality of first diodes having anode terminals electrically connected to the wires connected to a plurality of battery cells in which at least a voltage of a plus terminal of the corresponding battery cell is equal to or higher than a predetermined value among the plurality of battery cells and cathode terminals electrically connected to the cathode terminal of the Zener diode; and a second diode having an anode terminal connected to the power adjusting unit and a cathode terminal connected to the cathode terminal of the Zener diode. The breaker circuit may be a fuse having a first end connected to the minus terminal and a second end connected to the voltage detection circuit and the ground.

(5) The voltage detection device according to (1) may further include a power adjusting unit that adjusts electric power of the battery and supplies the adjusted electric power as driving power to the voltage detection circuit. In the voltage detection device according to (5), the overvoltage protection circuit may include: a switching element that includes a first terminal, a second terminal, and a third terminal; a control means that is connected to the first terminal and turns on the switching element when the voltage of the one or more wires is higher than the predetermined threshold value; a plurality of first diodes having anode terminals electrically connected to the wires connected to a plurality of battery cells in which at least a voltage of a plus terminal of the corresponding battery cell is equal to or higher than a predetermined value among the plurality of battery cells and cathode terminals connected to the second terminal; and a second diode having an anode terminal connected to the power adjusting unit and a cathode terminal connected to the second terminal. The third terminal may be electrically connected to the ground. The breaker circuit may be a fuse having a first end connected to the minus terminal and a second end connected to the voltage detection circuit and the ground.

According to the embodiment of the invention, since the breaker circuit brakes the circuit when an overvoltage is generated, it is possible to reliably stop operation of the voltage detection circuit.

DETAILED DESCRIPTION OF THE INVENTION

Hereinafter, first to fifth embodiments of the invention will be described with reference to the accompanying drawings.

First Embodiment

Figure 1:
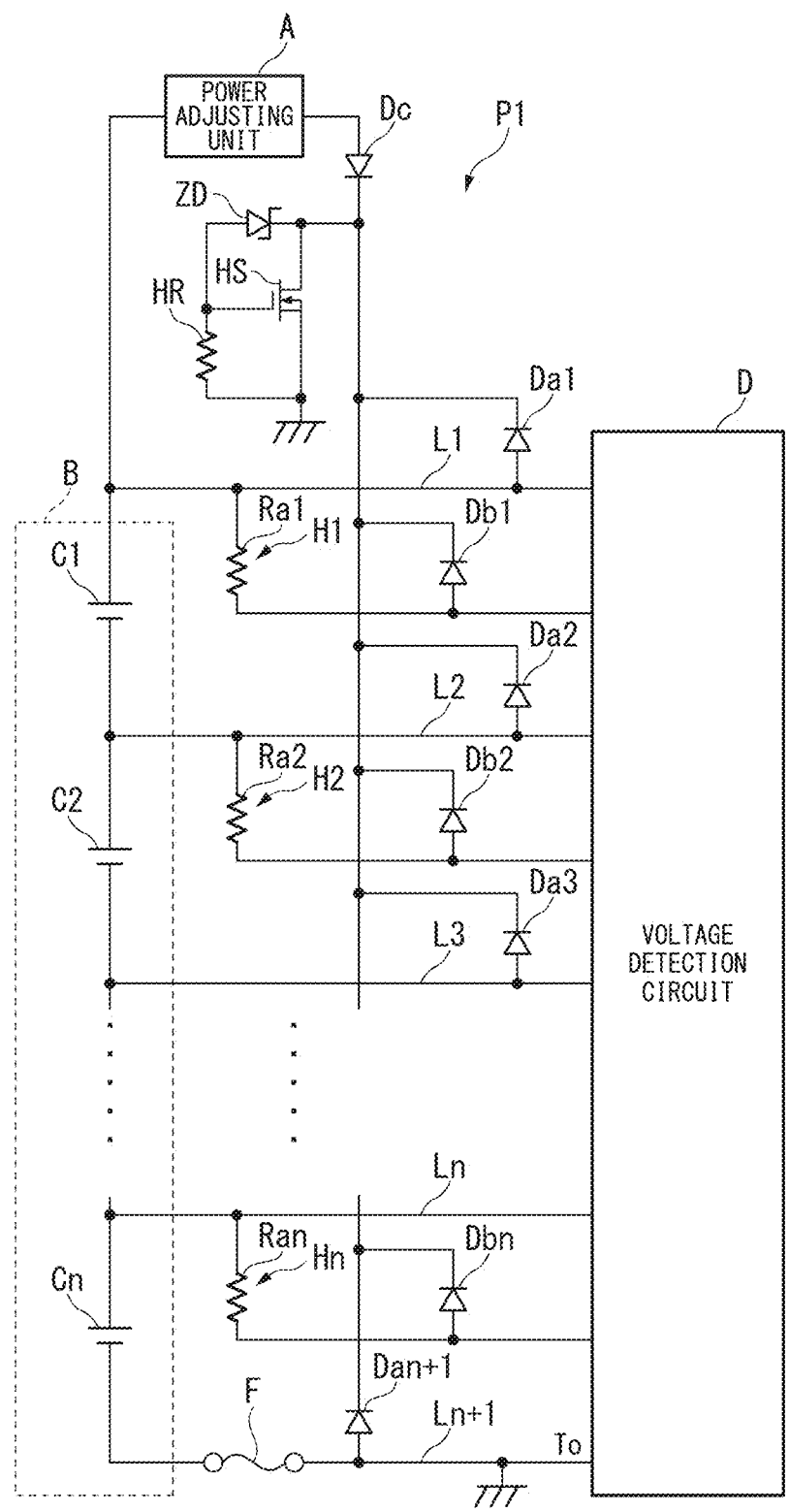
FIG. 1 is a circuit diagram of a voltage detection device according to a first embodiment of the invention.

A first embodiment will be described first. A voltage detection device according to the first embodiment is mounted in a moving vehicle such as an electric vehicle (EV) or a hybrid vehicle (HV). The voltage detection device according to the first embodiment monitors voltage states of battery cells C1 to Cn constituting a battery B. Here, n is an integer which is equal to or greater than 2. As illustrated in FIG. 1, the voltage detection device according to the first embodiment includes voltage detection lines L1 to Ln+1, discharge circuits H1 to Hn, a fuse F, a power adjusting unit A, an overvoltage protection circuit P1, and a voltage detection circuit D. The voltage detection lines L1 to Ln+1, the discharge circuits H1 to Hn, the fuse F (a breaker circuit), the power adjusting unit A, the overvoltage protection circuit P1, and the voltage detection circuit D are mounted on a board which is not illustrated.

The voltage detection lines L1 to Ln+1 are conducting lines that connect the battery cells C1 to Cn to the voltage detection circuit D. The voltage detection circuit D detects voltages of the battery cells C1 to Cn which are input via the voltage detection lines L1 to Ln+1.

The discharge circuits H1 to Hn connect the voltage detection lines L1 to Ln+1 to the ground. The discharge circuits H1 to Hn cause the battery cells C1 to Cn in an overcharged state to discharge electric power. The discharge circuits H1 to Hn include discharge resistors Ra1 to Ran, respectively, as illustrated in FIG. 1. Since the discharge circuits H1 to Hn have the same configuration, only the discharge resistor Ra1 of the discharge circuit H1 will be described below and the discharge resistors Ra2 to Ran of the discharge circuits H2 to Hn will not be described.

A first end of the discharge resistor Ra1 is connected to a positive electrode of the battery cell C1 via the voltage detection line L1 and a second end thereof is connected to the voltage detection circuit D. The second end of the discharge resistor Ra1 is connected to the voltage detection circuit D and is connected to the ground via a switching element which is disposed in the voltage detection circuit D.

When the switching element in the voltage detection circuit D is turned on, the discharge resistor Ra1 is supplied with electric power from the battery cell C1 and converts the electric power into thermal energy. That is, the discharge resistor Ra1 emits heat. When the battery cell C1 is in an overcharged state, the voltage detection circuit D causes the battery cells C1 to Cn in an overcharged state to discharge electric power to the discharge circuit H1 by turning on the switching element.

The fuse F is disposed between the minus terminal of the battery B and the voltage detection line Ln+1. That is, a first end of the fuse F is connected to the minus terminal of the battery B and a second end thereof is connected to a first end of the voltage detection line Ln+1. This fuse F is a breaker circuit that irreversibly brakes connection between the minus terminal of the battery B and the voltage detection line Ln using a flowing current which is a current flowing in the fuse F. The power adjusting unit A adjusts electric power from the battery B and supplies the adjusted electric power as driving power to the voltage detection circuit D. The power adjusting unit A is, for example, a DC/DC converter. As illustrated in FIG. 1, a first end of the voltage detection line Ln+1 is connected to the fuse F and a second end thereof is connected to a power terminal T0 on a lower potential side. As illustrated in FIG. 1, the power terminal T0 is connected to the ground. The power terminal T0 is connected to the minus terminal of the battery B via the fuse F.

The overvoltage protection circuit P1 is a circuit that protects the voltage detection circuit D from a voltage which is equal to or higher than a predetermined threshold value and which is generated in the voltage detection lines L1 to Ln+1, the discharge circuits H1 to Hn, and the power adjusting unit A. The overvoltage protection circuit P1 serves as an active clamp circuit. The overvoltage protection circuit P1 includes a Zener diode ZD, a protection switching element HS, a protection resistor HR, third diodes Da1 to Dan+1, first diodes Db1 to Dbn, and a second diode Dc.

The Zener diode ZD is connected to the voltage detection lines L1 to Ln+1, the discharge circuits H1 to Hn, and the power adjusting unit A via the third diodes Da1 to Dan+1, the first diodes Db1 to Dbn, and the second diode Dc. When a voltage equal to or higher than a predetermined threshold value which is generated in the voltage detection lines L1 to Ln+1, the discharge circuits H1 to Hn, and the power adjusting unit A is applied to a cathode terminal of the Zener diode ZD, a current flows from the cathode terminal to an anode terminal thereof.

The protection switching element HS is, for example, a bipolar transistor. In the protection switching element HS, a base terminal (a control terminal (a first terminal)) is connected to the anode terminal of the Zener diode ZD, an emitter terminal (a second terminal) is connected to the cathode terminal of the Zener diode ZD, and a collector terminal (a third terminal) is connected to the ground.

When a voltage equal to or higher than a predetermined threshold value is generated in the voltage detection lines L1 to Ln+1, the discharge circuits H1 to Hn, and the power adjusting unit A, a voltage equal to or higher than the predetermined threshold value is applied to the Zener diode ZD. When a voltage equal to or higher than the predetermined threshold value is applied to the Zener diode ZD, the protection switching element HS is turned on and discharges power with a voltage equal to or higher than the predetermined threshold value to the ground.

On the other hand, when a voltage equal to or higher than the predetermined threshold value is not generated in the voltage detection lines L1 to Ln+1, the discharge circuits H1 to Hn, and the power adjusting unit A, the protection switching element HS is in the OFF state. In the OFF state, the protection switching element HS stops discharge of power from the voltage detection lines L1 to Ln+1, the discharge circuits H1 to Hn, and the power adjusting unit A to the ground.

The protection switching element HS is not limited to a bipolar transistor and may be, for example, a field effect transistor (FET) or an insulated gate bipolar transistor (IGBT).

A first end of the protection resistor HR is connected to the anode terminal of the Zener diode ZD and a second end thereof is connected to the ground. The protection resistor HR adjusts a current which is input from the voltage detection lines L1 to Ln+1, the discharge circuits H1 to Hn, and the power adjusting unit A to the base terminal (the control terminal) of the protection switching element HS via the Zener diode ZD.

The third diode Da1 is provided to correspond to the voltage detection line L1. An anode terminal of the third diode Da1 is connected to the voltage detection line L1 and a cathode terminal thereof is connected to the cathode terminal of the Zener diode ZD. Similarly to the third diode Da1, the third diodes Da2 to Dan+1 are also provided to correspond to the voltage detection lines L2 to Ln+1.

The first diode Db1 is provided to correspond to the discharge circuit H1. An anode terminal of the first diode Db1 is connected to the discharge circuit H1 and a cathode terminal is connected to the cathode terminal of the Zener diode ZD. Similarly to the first diode Db1, the first diodes Db2 to Dbn are also provided to correspond to the discharge circuits H2 to Hn.

An anode terminal of the second diode Dc is connected to the power adjusting unit A and a cathode terminal thereof is connected to the cathode terminal of the Zener diode ZD.

The voltage detection circuit D is a dedicated IC chip that detects voltages of the battery cells C1 to Cn and has an A/D conversion function of converting the detection result into digital data (voltage detection data) or a communication function with a microcomputer which is not illustrated. The voltage detection circuit D operates with electric power of a first voltage (for example, 60 V). The voltage detection circuit D is connected to a microcomputer which operates with a second voltage (for example, 5 V) lower than the first voltage via an insulating element such as a photo-coupler. The voltage detection circuit D is electrically isolated from the microcomputer and can communicate with the microcomputer.

The operation of the voltage detection device according to the first embodiment will be described below.

In the voltage detection device according to the first embodiment, when a sudden overvoltage is generated in the voltage detection lines L1 to Ln+1, the discharge circuits H1 to Hn, and the power adjusting unit A, the overvoltage protection circuit P1 performs the following characteristic operation. That is, when an overvoltage higher than a predetermined threshold value is generated in the voltage detection lines L1 to Ln+1, the discharge circuits H1 to Hn, and the power adjusting unit A, the overvoltage is applied to the cathode terminal of the Zener diode ZD and a current flows out from the cathode terminal of the Zener diode ZD to the anode terminal thereof.

When a current flows out from the cathode terminal of the Zener diode ZD to the anode terminal, a current is input from the Zener diode ZD to the control terminal (the first terminal) of the protection switching element HS. The protection switching element HS is turned on when a current is input from the Zener diode ZD to the control terminal (the first terminal) thereof. When the protection switching element HS is in the ON state, the overvoltage higher than the predetermined threshold value generated in the voltage detection lines L1 to Ln+1, the discharge circuits H1 to Hn, and the power adjusting unit A is discharged to the ground. Accordingly, the overvoltage protection circuit P1 can protect the voltage detection circuit D from the overvoltage.

The voltage detection device according to the first embodiment includes the overvoltage protection circuit P1 that protects the voltage detection circuit D from a voltage equal to or higher than a predetermined threshold value which is generated in the voltage detection lines L1 to Ln+1, the discharge circuits H1 to Hn, and the power adjusting unit A.

For example, when it is assumed that a withstand voltage of the voltage detection circuit D is 80 V and the predetermined threshold value is set to 75 V and a voltage of 75 V is applied to the cathode terminal of the Zener diode ZD, a current flows out from the cathode terminal of the Zener diode ZD to the anode terminal thereof. When an overvoltage equal to or higher than 75 V is generated in the voltage detection lines L1 to Ln+1, the discharge circuits H1 to Hn, and the power adjusting unit A, an overvoltage equal to or higher than 75 V is applied to the cathode terminal of the Zener diode ZD. When an overvoltage equal to or higher than 75 V is applied to the cathode terminal of the Zener diode ZD, a current flows out from the cathode terminal of the Zener diode ZD to the anode terminal thereof and the protection switching element HS is turned on. Accordingly, since the overvoltage equal to or higher than 75 V is discharged to the ground, the overvoltage protection circuit P1 can protect the voltage detection circuit D from the overvoltage.

In the voltage detection device according to the first embodiment, when an overvoltage is generated in a battery cell and the overvoltage protection circuit P1 is activated, a current flows in the fuse F. That is, the ground of the overvoltage protection circuit P1 is electrically connected to the ground of the voltage detection circuit D. Accordingly, in the voltage detection device according to the first embodiment, when an overvoltage is generated in a battery cell and the overvoltage protection circuit P1 is activated, a current flows into the fuse F via the overvoltage protection circuit P1 and the ground. As a result, the fuse F melts, thereby cutting the connection, and the power terminal T0 on a low potential side reaches a floating state.

Accordingly, the power terminal T0 of the voltage detection circuit D becomes a floating state due to the melting of the fuse F. As a result, the operation of the voltage detection circuit D is reliably stopped.

Second Embodiment

Figure 2:
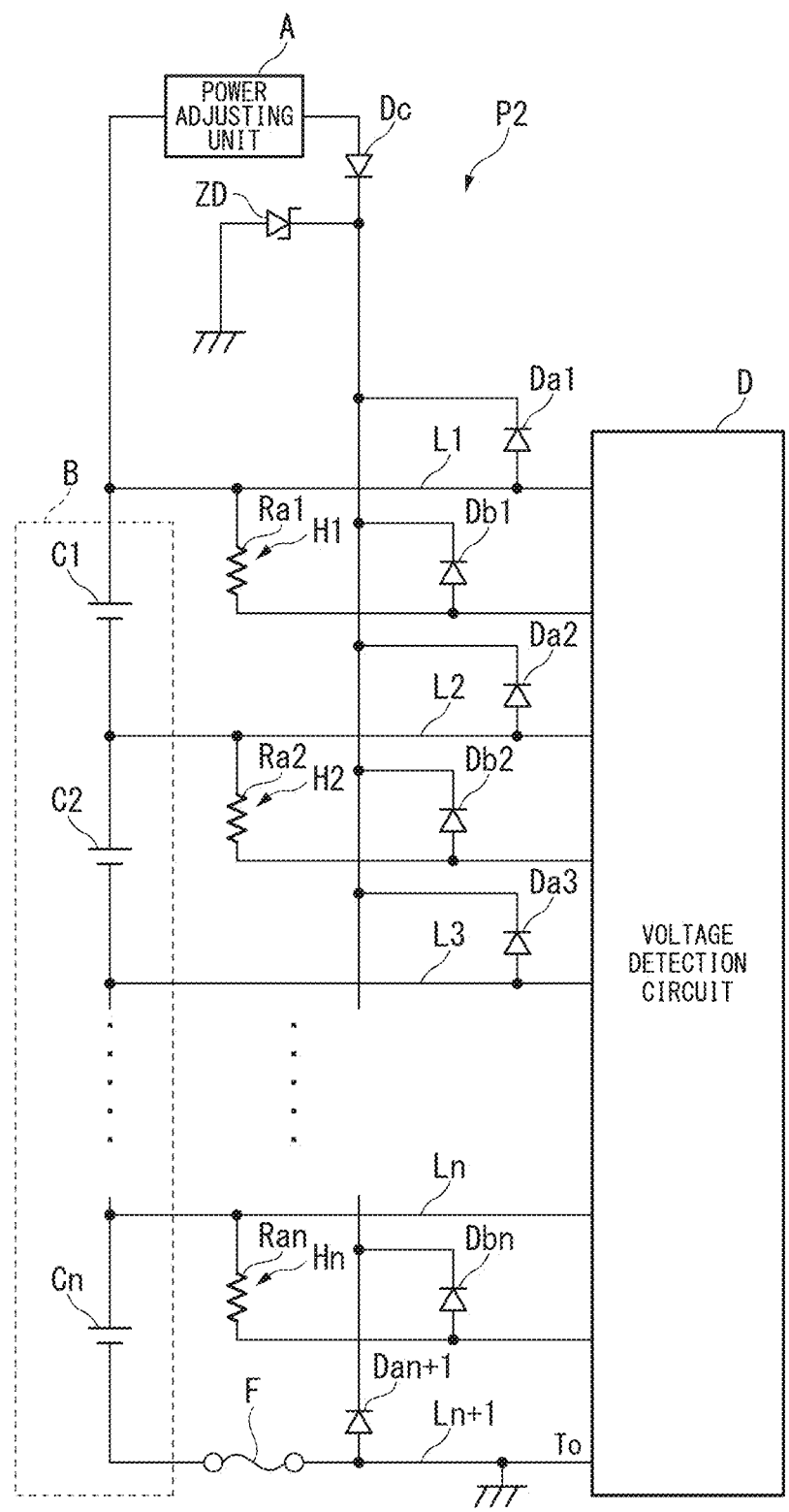
FIG. 2 is a circuit diagram of a voltage detection device according to a second embodiment of the invention.

A voltage detection device according to a second embodiment will be described below. The voltage detection device according to the second embodiment is different from the voltage detection device according to the first embodiment in that the configuration of an overvoltage protection circuit P2 is different from the overvoltage protection circuit P1 in the first embodiment as illustrated in FIG. 2. The elements of the voltage detection device according to the second embodiment other than the overvoltage protection circuit are the same as the elements of the voltage detection device according to the first embodiment. Accordingly, the same or similar elements as in the voltage detection device according to the first embodiment out of the elements of the voltage detection device according to the second embodiment will be referred to by the same reference signs and description thereof will not be repeated.

The voltage detection device according to the second embodiment includes voltage detection lines L1 to Ln+1, discharge circuits H1 to Hn, a fuse F, a power adjusting unit A, a overvoltage protection circuit P2, and a voltage detection circuit D as illustrated in FIG. 2. The voltage detection lines L1 to Ln+1, the discharge circuits H1 to Hn, the fuse F (a breaker circuit), the power adjusting unit A, the overvoltage protection circuit P2, and the voltage detection circuit D are mounted in a board which is not illustrated.

Similarly to the first embodiment, the overvoltage protection circuit P2 is a circuit that protects the voltage detection circuit D from a voltage which is equal to or higher than a predetermined threshold value and which is generated in the voltage detection lines L1 to Ln+1, the discharge circuits H1 to Hn, and the power adjusting unit A. The overvoltage protection circuit P2 includes a Zener diode ZD, third diodes Da1 to Dan+1, first diodes Db1 to Dbn, and a second diode Dc.

The Zener diode ZD is connected to the voltage detection lines L1 to Ln+1, the discharge circuits H1 to Hn, and the power adjusting unit A via the third diodes Da1 to Dan+1, the first diodes Db1 to Dbn, and the second diode Dc. When a voltage equal to or higher than a predetermined threshold value which is generated in the voltage detection lines L1 to Ln+1, the discharge circuits H1 to Hn, and the power adjusting unit A is applied to a cathode terminal of the Zener diode ZD, a current flows from the cathode terminal to an anode terminal thereof. The anode terminal of the Zener diode ZD is connected to the ground.

The third diode Da1 is provided to correspond to the voltage detection line L1. An anode terminal of the third diode Da1 is connected to the voltage detection line L1 and a cathode terminal thereof is connected to the cathode terminal of the Zener diode ZD. Similarly to the third diode Da1, the third diodes Da2 to Dan+1 are also provided to correspond to the voltage detection lines L2 to Ln+1.

The first diode Db1 is provided to correspond to the discharge circuit H1. An anode terminal of the first diode Db1 is connected to the discharge circuit H1 and a cathode terminal is connected to the cathode terminal of the Zener diode ZD. Similarly to the first diode Db1, the first diodes Db2 to Dbn are also provided to correspond to the discharge circuits H2 to Hn.

An anode terminal of the second diode Dc is connected to the power adjusting unit A and a cathode terminal thereof is connected to the cathode terminal of the Zener diode ZD.

For example, when it is assumed that a withstand voltage of the voltage detection circuit D is 80 V and the predetermined threshold value is set to 75 V and a voltage of 75 V is applied to the cathode terminal of the Zener diode ZD, a current flows out from the cathode terminal of the Zener diode ZD to the anode terminal thereof. When an overvoltage equal to or higher than 75 V is generated in the voltage detection lines L1 to Ln+1, the discharge circuits H1 to Hn, and the power adjusting unit A, an overvoltage equal to or higher than 75 V is applied to the cathode terminal of the Zener diode ZD. When an overvoltage equal to or higher than 75 V is applied to the cathode terminal of the Zener diode ZD, a current flows out from the cathode terminal of the Zener diode ZD to the anode terminal thereof. Accordingly, since the overvoltage equal to or higher than 75 V is discharged to the ground via the Zener diode ZD, the voltage detection circuit D is protected from the overvoltage.

The voltage detection device according to the second embodiment can protect the voltage detection circuit D from an overvoltage and reliably stop the operation of the voltage detection circuit D. In the voltage detection device according to the second embodiment, when an overvoltage is generated in a battery cell and the overvoltage protection circuit P2 is activated, a current flows into the fuse F via the overvoltage protection circuit P2 and the ground. The ground of the overvoltage protection circuit P2 is electrically connected to the ground of the voltage detection circuit D. Accordingly, when the overvoltage protection circuit P2 is activated, the fuse F in the second embodiment melts, thereby cutting the connection, and the power terminal T0 reaches a floating state.

Accordingly, the power terminal T0 on a low potential side of the voltage detection circuit D becomes a floating state due to the melting of the fuse F. As a result, the operation of the voltage detection circuit D is reliably stopped.

Third Embodiment

Figure 3:
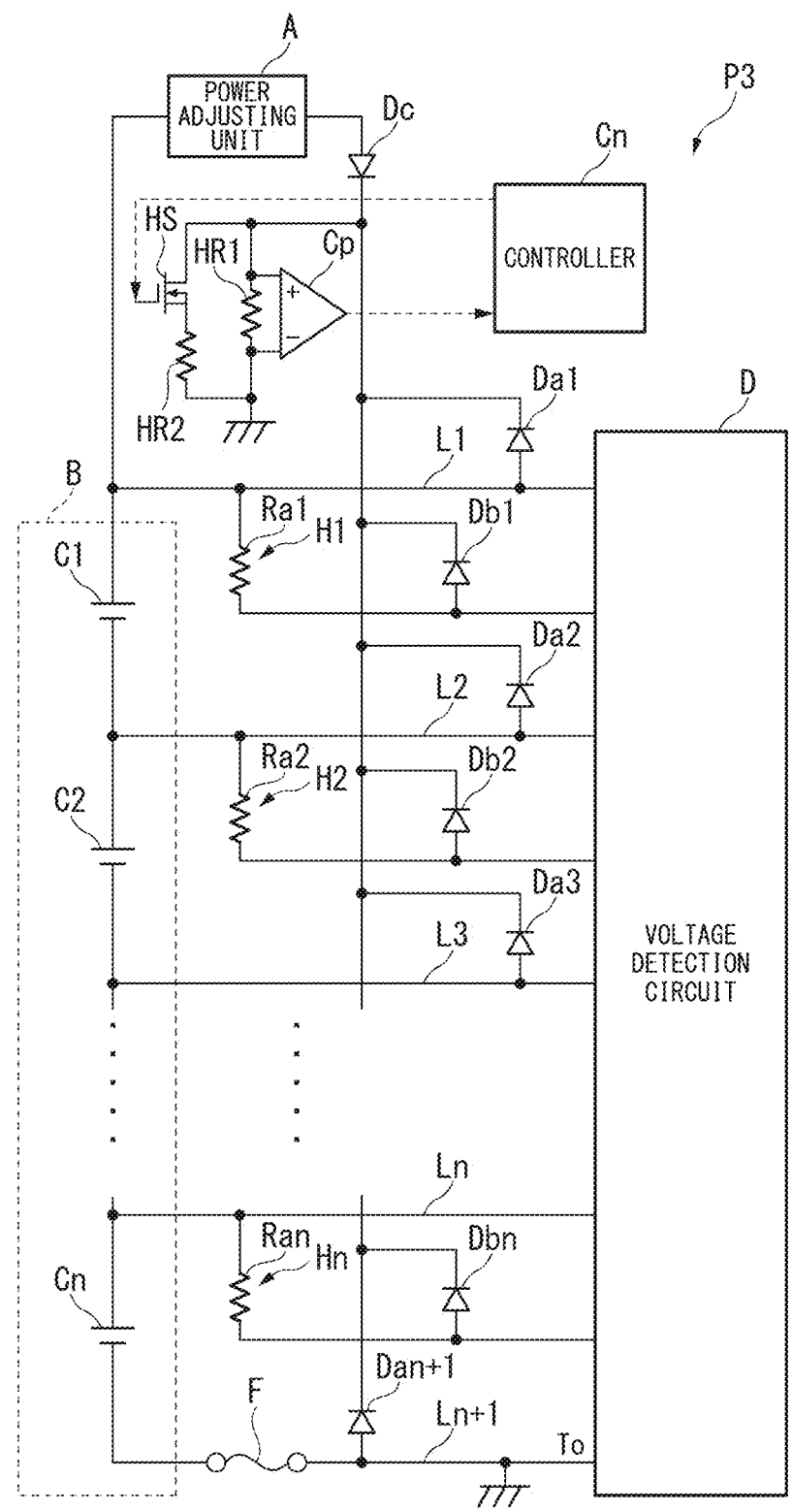
FIG. 3 is a circuit diagram of a voltage detection device according to a third embodiment of the invention.

A voltage detection device according to a third embodiment will be described below. The voltage detection device according to the third embodiment is different from the voltage detection device according to the first embodiment in that the configuration of an overvoltage protection circuit P3 is different from the overvoltage protection circuit P1 in the first embodiment as illustrated in FIG. 3. The elements of the voltage detection device according to the third embodiment other than the overvoltage protection circuit are the same as the elements of the voltage detection device according to the first embodiment. Accordingly, the same or similar elements as in the voltage detection device according to the first embodiment out of the elements of the voltage detection device according to the third embodiment will be referred to by the same reference signs and description thereof will not be repeated.

The voltage detection device according to the third embodiment includes voltage detection lines L1 to Ln+1, discharge circuits H1 to Hn, a fuse F, a power adjusting unit A, a overvoltage protection circuit P3, and a voltage detection circuit D as illustrated in FIG. 3. The voltage detection lines L1 to Ln+1, the discharge circuits H1 to Hn, the fuse F (a breaker circuit), the power adjusting unit A, the overvoltage protection circuit P3, and the voltage detection circuit D are mounted in a board which is not illustrated.

Similarly to the first embodiment, the overvoltage protection circuit P3 is a circuit that protects the voltage detection circuit D from a voltage which is equal to or higher than a predetermined threshold value and which is generated in the voltage detection lines L1 to Ln+1, the discharge circuits H1 to Hn, and the power adjusting unit A. The overvoltage protection circuit P3 includes a comparator Cp, a controller Cn, a protection switching element Hs, a first protection resistor HR1, a second protection resistor HR2, third diodes Da1 to Dan+1, first diodes Db1 to Dbn, and a second diode Dc. The comparator Cp and the controller Cn constitute a control means in the third embodiment.

Among a first input terminal and a second input terminal which are two input terminals of the comparator Cp, the first input terminal is connected to cathode terminals of the third diodes Da1 to Dan+1, the first diodes Db1 to Dbn, and the second diode Dc, and the second input terminal is connected to the ground. The comparator Cp includes the first protection resistor HR1 between the first input terminal and the second input terminal. An output terminal of the comparator Cp is connected to the controller Cn. The comparator Cp outputs a comparison result from the output terminal to the controller Cn.

The controller Cn controls the protection switching element HS. The controller Cn determines whether a voltage equal to or higher than a predetermined threshold value is generated in the voltage detection lines L1 to Ln+1, the discharge circuits H1 to Hn, and the power adjusting unit A on the basis of the comparison result input from the comparator Cp. When it is determined that a voltage equal to or higher than the predetermined threshold value is generated, the controller Cn turns on the protection switching element HS.

The protection switching element HS is, for example, a bipolar transistor. In the protection switching element HS, a base terminal (a control terminal) is connected to the controller Cn, an emitter terminal is connected to the cathode terminals of the third diodes Da1 to Dan+1, the first diodes Db1 to Dbn, and the second diode Dc, and a collector terminal is connected to the ground via the second protection resistor HR2.

When a voltage equal to or higher than a predetermined threshold value is generated in the voltage detection lines L1 to Ln+1, the discharge circuits H1 to Hn, and the power adjusting unit A, the protection switching element HS is controlled in the ON state by the controller Cn. The protection switching element HS in the ON state discharges power with the voltage equal to or higher than the predetermined threshold value to the ground.

When a voltage equal to or higher than the predetermined threshold value is not generated in the voltage detection lines L1 to Ln+1, the discharge circuits H1 to Hn, and the power adjusting unit A, the protection switching element HS is controlled in the OFF state by the controller Cn. The protection switching element HS in the OFF state stops discharge of power from the voltage detection lines L1 to Ln+1, the discharge circuits H1 to Hn, and the power adjusting unit A to the ground.

The protection switching element HS is not limited to a bipolar transistor but may be, for example, a field effect transistor (FET) or an insulated gate bipolar transistor (IGBT).

The first protection resistor HR1 is disposed between the first input terminal and the second input terminal which are two input terminals of the comparator Cp.

A first end of the second protection resistor HR2 is connected to the collector terminal of the protection switching element HS and a second end thereof is connected to the ground.

For example, when a withstand voltage of the voltage detection circuit D is 80 V and the predetermined threshold value is set to 75 V, the controller Cn determines whether an overvoltage equal to or higher than 75 V is generated in the voltage detection lines L1 to Ln+1, the discharge circuits H1 to Hn, and the power adjusting unit A on the basis of the comparison result input from the comparator Cp. When it is determined that an overvoltage equal to or higher than 75 V is generated, the controller Cn turns on the protection switching element HS. Accordingly, since the overvoltage equal to or higher than 75 V is discharged to the ground via the protection switching element HS, the overvoltage protection circuit P3 can protect the voltage detection circuit D from the overvoltage.

The voltage detection device according to the third embodiment can protect the voltage detection circuit D from an overvoltage and reliably stop the operation of the voltage detection circuit D. In the voltage detection device according to the third embodiment, when an overvoltage is generated in a battery cell and the overvoltage protection circuit P3 is activated, a current flows into the fuse F via the overvoltage protection circuit P3 and the ground. The ground of the overvoltage protection circuit P3 is electrically connected to the ground of the voltage detection circuit D. Accordingly, the fuse F in the third embodiment melts, thereby cutting the connection, and the power terminal T0 on a low potential side reaches a floating state.

Accordingly, the power terminal T0 on a low potential side of the voltage detection circuit D becomes a floating state due to melting and cutting of the fuse F. As a result, the operation of the voltage detection circuit D is reliably stopped.

Fourth Embodiment

A voltage detection device according to a fourth embodiment will be described below. The same or similar elements as in the voltage detection device according to the first embodiment out of the elements of the voltage detection device according to the fourth embodiment will be referred to by the same reference signs and description thereof will not be repeated.

The voltage detection device according to the fourth embodiment is different from the voltage detection device according to the first embodiment in that the third diodes Da1 to Dan+1 are not provided.

Figure 4:
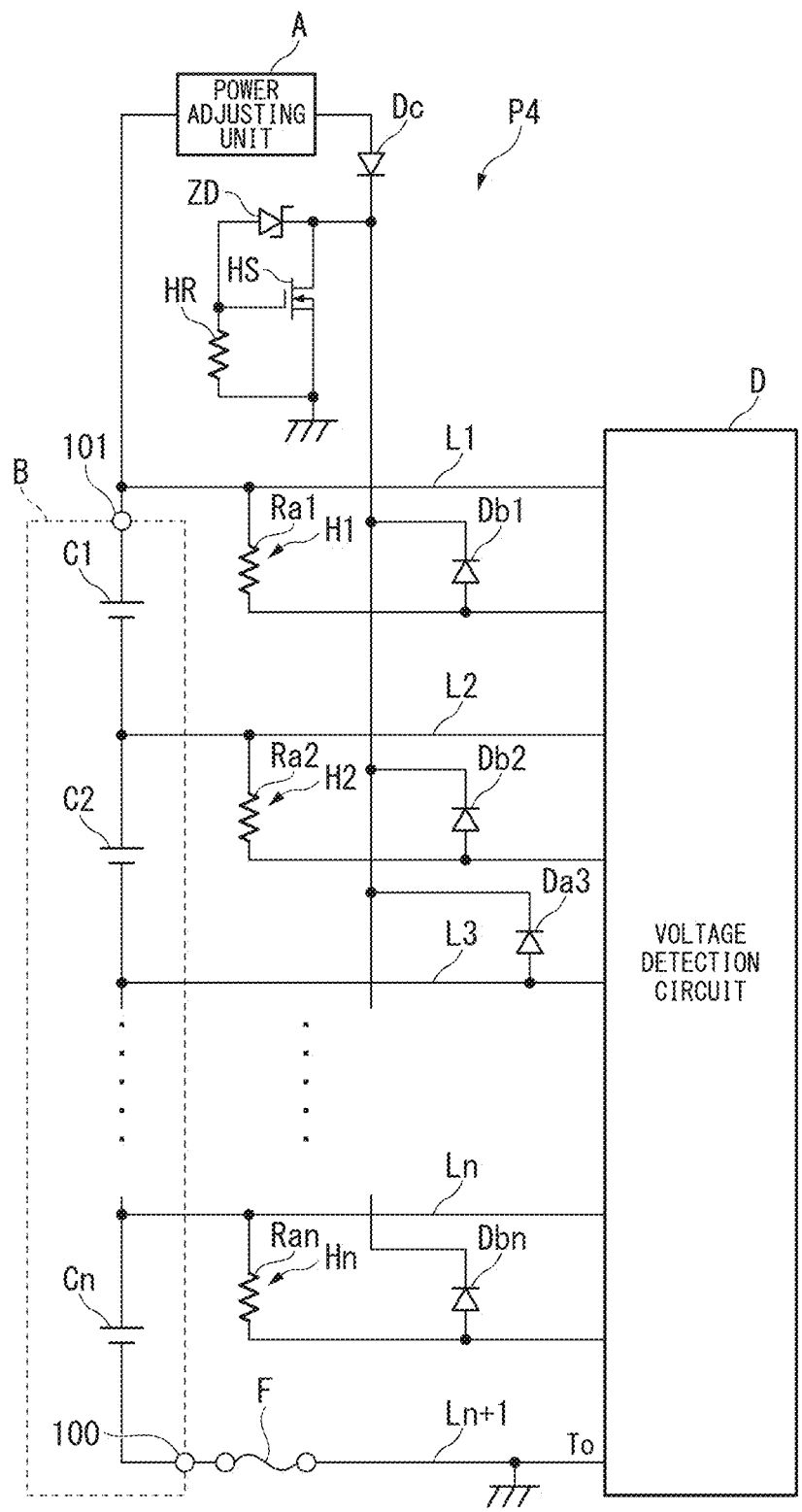
FIG. 4 is a circuit diagram of a voltage detection device according to a fourth embodiment of the invention.

The voltage detection device according to the fourth embodiment includes voltage detection lines L1 to Ln+1, discharge circuits H1 to Hn, a fuse F, a power adjusting unit A, a overvoltage protection circuit P4, and a voltage detection circuit D as illustrated in FIG. 4. The voltage detection lines L1 to Ln+1, the discharge circuits H1 to Hn, the fuse F (a breaker circuit), the power adjusting unit A, the overvoltage protection circuit P4, and the voltage detection circuit D are mounted in a board which is not illustrated.

The overvoltage protection circuit P4 is a circuit that protects the voltage detection circuit D from a voltage which is equal to or higher than a predetermined threshold value and which is generated in the voltage detection lines L1 to Ln, the discharge circuits H1 to Hn, and the power adjusting unit A. When a voltage of one or more voltage detection lines among the plurality of voltage detection lines L1 to Ln is higher than a predetermined threshold value, the overvoltage protection circuit P4 electrically connects the one or more voltage detection lines L1 to Ln to a minus terminal 100 of the battery B. The overvoltage protection circuit P4 includes a Zener diode ZD, a protection switching element HS, a protection resistor HR, first diodes Db1 to Dbn, and a second diode Dc. A plus terminal 101 of the battery B is connected to a first end of the voltage detection line L1.

The first diode Db1 is provided to correspond to the discharge circuit H1. An anode terminal of the first diode Db1 is connected to the discharge circuit H1 and a cathode terminal is connected to the cathode terminal of the Zener diode ZD. Similarly to the first diode Db1, the first diodes Db2 to Dbn are also provided to correspond to the discharge circuits H2 to Hn. That is, the first diode Dbn is provided to correspond to the discharge circuit Hn. An anode terminal of the first diode Dbn is connected to the discharge circuit Hn and a cathode terminal thereof is connected to the cathode terminal of the Zener diode ZD.

An anode terminal of the second diode Dc is connected to the power adjusting unit A and a cathode terminal thereof is connected to the cathode terminal of the Zener diode ZD.

For example, when it is assumed that a withstand voltage of the voltage detection circuit D is 80 V and the predetermined threshold value is set to 75 V and a voltage of 75 V is applied to the cathode terminal of the Zener diode ZD, a current flows out from the cathode terminal of the Zener diode ZD to the anode terminal thereof. When an overvoltage equal to or higher than 75 V is generated in one of inputs of the voltage detection lines L1 to Ln, the discharge circuits H1 to Hn, and the power adjusting unit A, the overvoltage equal to or higher than 75 V is applied to the cathode terminal of the Zener diode ZD.

For example, when a voltage equal to or higher than a predetermined threshold value is generated in one or more voltage detection lines out of the voltage detection lines L1 to Ln, an overvoltage equal to or higher than 75 V is applied to the cathode terminal of the Zener diode ZD via the first diode Db connected to the one or more voltage detection lines L. When a voltage equal to or higher than a predetermined threshold value is generated in one or more discharge circuits H out of the discharge circuits H1 to Hn, the voltage equal to or higher than the predetermined threshold value is applied to the voltage detection line L connected to the one or more discharge circuits H. When a voltage equal to or higher than a predetermined threshold value is generated in one or more discharge circuits H out of the discharge circuits H1 to Hn, an overvoltage equal to or higher than 75 V is applied to the cathode terminal of the Zener diode ZD via the first diode Db connected to the one or more voltage detection lines L.

When an overvoltage equal to or higher than 75 V is generated in the power adjusting unit A, the voltage equal to or higher than the predetermined threshold value is applied to the voltage detection line L1. The overvoltage equal to or higher than 75 V is applied to the cathode terminal of the Zener diode ZD via the first diode Db1.

When the overvoltage equal to or higher than 75 V is applied to the cathode terminal of the Zener diode ZD, a current flows out from the cathode terminal of the Zener diode ZD to the anode terminal and the protection switching element HS is turned on. Accordingly, the overvoltage protection circuit P4 electrically connects the plurality of voltage detection lines L1 to Ln to the minus terminal 100 of the battery B via the ground.

When the voltage of one or more voltage detection lines L is higher than a predetermined threshold value, the overvoltage protection circuit P4 electrically connects the plurality of voltage detection lines L1 to Ln to the minus terminal 100 of the battery B via the fuse F by electrically connecting the plurality of voltage detection lines L1 to Ln to the ground. Accordingly, in the voltage detection device according to the fourth embodiment, when an overvoltage is generated in a battery cell and the overvoltage protection circuit P4 is activated, a current flows into the fuse F via the overvoltage protection circuit P4 and the ground. Accordingly, when the overvoltage protection circuit P4 is activated, the fuse F melts, thereby cutting the connection, and the power terminal T0 reaches a floating state. Accordingly, the power terminal T0 on a low potential side of the voltage detection circuit D becomes a floating state due to the melting of the fuse F. As a result, the operation of the voltage detection circuit D is reliably stopped.

Fifth Embodiment

A voltage detection device according to a fifth embodiment will be described below. The same or similar elements as in the voltage detection device according to the first embodiment out of the elements of the voltage detection device according to the fifth embodiment will be referred to by the same reference signs and description thereof will not be repeated.

The voltage detection device according to the fifth embodiment is different from the voltage detection device according to the first embodiment in that the third diodes Da1 to Dan+1 are not provided. The voltage detection device according to the fifth embodiment is different from the voltage detection device according to the first embodiment in that only first diodes Db1 to Dbm out of the first diodes Db1 to Dbn are provided. Here, m is an integer equal to or greater than 2 and less than n ($2 \leq m < n$).

Figure 5:
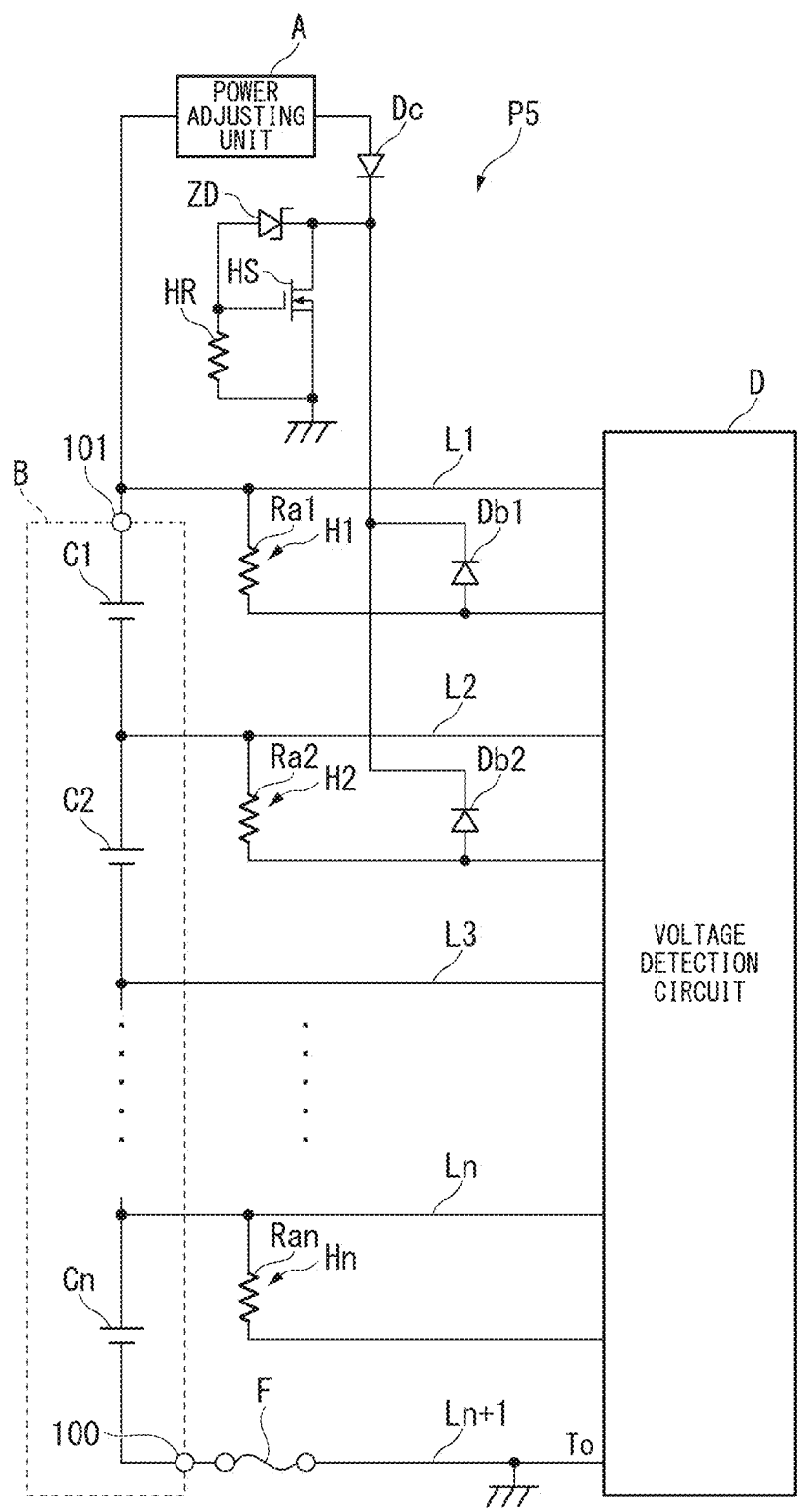
FIG. 5 is a circuit diagram of a voltage detection device according to a fifth embodiment of the invention.

The voltage detection device according to the fifth embodiment includes voltage detection lines L1 to Ln+1, discharge circuits H1 to Hn, a fuse F, a power adjusting unit A, a overvoltage protection circuit P5, and a voltage detection circuit D as illustrated in FIG. 5. The voltage detection lines L1 to Ln+1, the discharge circuits H1 to Hn, the fuse F (a breaker circuit), the power adjusting unit A, the overvoltage protection circuit P5, and the voltage detection circuit D are mounted in a board which is not illustrated.

The overvoltage protection circuit P5 is a circuit that protects the voltage detection circuit D from a voltage which is equal to or higher than a predetermined threshold value and which is generated in the voltage detection lines L1 to Lm, the discharge circuits H1 to Hm, and the power adjusting unit A. When a voltage of one or more voltage detection lines among the plurality of voltage detection lines L1 to Lm is higher than a predetermined threshold value, the overvoltage protection circuit P5 electrically connects the one or more voltage detection lines L to a minus terminal 100 of the battery B. A plus terminal 101 of the battery B is connected to a first end of the voltage detection line L1.

The overvoltage protection circuit P5 includes a Zener diode ZD, a protection switching element HS, a protection resistor HR, first diodes Db1 to Dbm, and a second diode Dc.

The first diode Db1 is provided to correspond to the discharge circuit H1. An anode terminal of the first diode Db1 is connected to the discharge circuit H1 and a cathode terminal is connected to the cathode terminal of the Zener diode ZD. Similarly to the first diode Db1, the first diodes Db2 to Dbm are also provided to correspond to the discharge circuits H2 to Hm. FIG. 5 is a circuit diagram of the voltage detection device according to the fifth embodiment when m is 2.

The first diodes Db1 to Dbn are classified into a first group or a second group. The first group includes the first diodes Db1 to Dbm. The second ground includes the first diodes Dbm+1 to Dbn.

The voltage detection device according to the fifth embodiment includes only the first diodes Db1 to Dbm included in the first group among the first diodes Db1 to Dbn and does not include the second group.

The first diodes Db1 to Dbm included in the first group are connected to the battery cells in which a voltage of a plus terminal of the battery cell with respect to the ground is equal to or higher than a predetermined value Tth among the plurality of battery cells C1 to Cn which are connected in series. The predetermined value Vth is set, for example, on the basis of a withstand voltage of an input terminal of the voltage detection circuit D. For example, the predetermined value Vth is a value causing the withstand voltage to have a margin. When the withstand voltage of the voltage detection circuit D is 80 V, the predetermined value Tth is, for example, 50 V or 60 V. The input terminal of the voltage detection circuit D is a terminal of the voltage detection circuit D which is connected to the voltage detection lines L1 to Ln. In the example illustrated in FIG. 5, the voltages of the plus terminals of the battery cells C3 to Cn are less than the predetermined value Vth. In the example illustrated in FIG. 5, the voltage of the plus terminal of the battery cell C2 is equal to or higher than the predetermined value Vth. The voltage of the plus terminal of the battery cell C1 is equal to or higher than the predetermined value Vth. In the example illustrated in FIG. 5, the withstand voltage of the voltage detection circuit D is much higher than the voltages of the battery cells C3 to Cn. Accordingly, the overvoltage protection circuit P5 does not need to protect the voltage detection circuit D from the voltages of the battery cells C3 to Cn. Accordingly, in the example illustrated in FIG. 5, the first group includes the first diode Db1 and the first diode Db2.

The voltage detection line L1 is connected to the plus terminal of the battery cell C1 in which the voltage of the plus terminal of the battery cell is equal to or higher than the predetermined value Vth among the battery cells C1 to Cn which are connected in series. The anode terminal of the first diode Db1 is electrically connected to the voltage detection line L1. The cathode terminal of the first diode Db1 is connected to the cathode terminal of the Zener diode ZD.

The voltage detection line L2 is connected to the plus terminal of the battery cell C2 in which the voltage of the plus terminal of the battery cell is equal to or higher than the predetermined value Vth among the battery cells C1 to Cn which are connected in series. The anode terminal of the first diode Db2 is electrically connected to the voltage detection line L2. The cathode terminal of the first diode Db2 is connected to the cathode terminal of the Zener diode ZD.

An anode terminal of the second diode Dc is connected to the power adjusting unit A and a cathode terminal thereof is connected to the cathode terminal of the Zener diode ZD.

For example, when it is assumed that a withstand voltage of the voltage detection circuit D is 80 V and the predetermined threshold value is set to 75 V and a voltage of 75 V is applied to the cathode terminal of the Zener diode ZD, a current flows out from the cathode terminal of the Zener diode ZD to the anode terminal thereof. When an overvoltage equal to or higher than 75 V is generated in one of inputs of the voltage detection lines L1 to Ln, the discharge circuits H1 to Hn, and the power adjusting unit A, the overvoltage equal to or higher than 75 V is applied to the cathode terminal of the Zener diode ZD.

In the example illustrated in FIG. 5, when a voltage equal to or higher than a predetermined threshold value is generated in one voltage detection line out of the voltage detection line L1 and the voltage detection line L2, for example, an overvoltage equal to or higher than 75 V is applied to the cathode terminal of the Zener diode ZD via the first diode Db1 or Db2. When a voltage equal to or higher than a predetermined threshold value is generated in one discharge circuit H out of the discharge circuit H1 and the discharge circuit H2, the voltage equal to or higher than the predetermined threshold value is applied to the voltage detection line L1 or the voltage detection line L2. When a voltage equal to or higher than a predetermined threshold value is generated in one discharge circuit H out of the discharge circuits H1 and H2, an overvoltage equal to or higher than 75 V is applied to the cathode terminal of the Zener diode ZD via the first diode Db1 or Db2 connected to the voltage detection line L1 or L2.

When an overvoltage equal to or higher than 75 V is generated in the power adjusting unit A, the voltage equal to or higher than the predetermined threshold value is applied to the voltage detection line L1. The overvoltage equal to or higher than 75 V is applied to the cathode terminal of the Zener diode ZD via the first diode Db1.

When the overvoltage equal to or higher than 75 V is applied to the cathode terminal of the Zener diode ZD, a current flows out from the cathode terminal of the Zener diode ZD to the anode terminal and the protection switching element HS is turned on. Accordingly, the overvoltage protection circuit P5 electrically connects the plurality of voltage detection lines L1 to Lm to the minus terminal 100 of the battery B via the ground.

When the voltage of one of the voltage detection lines L1 to Lm is higher than a predetermined threshold value, the overvoltage protection circuit P5 electrically connects the plurality of voltage detection lines L1 to Lm to the ground. The overvoltage protection circuit P5 electrically connects the plurality of voltage detection lines L1 to Lm to the minus terminal 100 of the battery B via the fuse F. Accordingly, in the voltage detection device according to the fifth embodiment, when an overvoltage is generated in a battery cell and the overvoltage protection circuit P5 is activated, a current flows into the fuse F via the overvoltage protection circuit P5 and the ground. Accordingly, when the overvoltage protection circuit P5 is activated, the fuse F melts, thereby cutting the connection, and the power terminal T0 reaches a floating state. Accordingly, the power terminal T0 on a low potential side of the voltage detection circuit D becomes a floating state due to melting and cutting of the fuse F. As a result, the operation of the voltage detection circuit D is reliably stopped.

While the first to fifth embodiments have been described above, the invention is not limited to the first to fifth embodiments and is considered to be modified, for example, as follows.

(1) The breaker circuit in the first to fifth embodiments is not limited to the fuse F, and the breaker circuit may be a single circuit element or a plurality of circuit elements other than the fuse F.

(2) The second ends of the discharge resistors Ra1 to Ran in the first to fifth embodiments are connected to a switching element which is disposed in the voltage detection circuit D. Here, the switching element may be provided in the discharge circuits H1 to Hn instead of in the voltage detection circuit D.

(3) The controller Cn in the third embodiment may be integrated with the voltage detection circuit D.

(4) The voltage detection device according to the fifth embodiment has only to include at least the first diodes Db1 to Dbm. The voltage detection device according to the fifth embodiment may include only the first diodes Db1 to Dbm or may include one or more diodes of the first diodes Dbm+1 to Dbn in addition to the first diodes Db1 to Dbm.

(5) The voltage detection devices according to the first to fifth embodiments may not include the discharge circuits H1 to Hn.

With the above-mentioned voltage detection device, it is possible to reliably stop operation of the voltage detection circuit.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

EXPLANATION OF REFERENCES

L1-Ln+1 Voltage detection line
H1-Hn Discharge circuit
A Power adjusting unit
P Overvoltage protection circuit
D Voltage detection circuit
ZD Zener diode
HS Protection switching element
HR Protection resistor
HR1 First protection resistor
HR2 Second protection resistor
Da1-Dan+1 first diode
Db1-Dbn+1 second diode
Dc Third diode
Cp Comparator
Cn Controller
F Fuse (breaker circuit)

What is claimed is:

1. A voltage detection device comprising:
a plurality of wires that are connected to a plurality of battery cells of a battery;
a voltage detection circuit that operates with supply of electric power from the battery and detects voltages of the plurality of battery cells via the plurality of wires;
an overvoltage protection circuit that:
is electrically connected to the plurality of wires, detects voltages of the wires, and
electrically connects the wires to a minus terminal of the battery when the voltage of at least one of the wires is higher than a predetermined threshold value; and
a breaker circuit that irreversibly breaks electrical connection between the minus terminal and the voltage detection circuit using a current flowing from the plurality of wires to the minus terminal.

2. The voltage detection device according to claim 1, wherein the breaker circuit is a fuse having a first end connected to the minus terminal and a second end connected to the voltage detection circuit and a ground, and
wherein the overvoltage protection circuit electrically connects the plurality of wires to the minus terminal via the breaker circuit by electrically connecting the plurality of wires to the ground when the voltage of at least one of the wires is higher than the predetermined threshold value.

3. The voltage detection device according to claim 1, further comprising a power adjusting unit that adjusts electric power of the battery and supplies the adjusted electric power as driving power to the voltage detection circuit,
wherein the overvoltage protection circuit includes:
a Zener diode in which a current flows when a voltage equal to or higher than the predetermined threshold value is applied thereto;
a switching element that includes three terminals and in which a first terminal serving as a control terminal among the three terminals is connected to an anode terminal of the Zener diode, a second terminal among the other two terminals is connected to a cathode terminal of the Zener diode, and a third terminal is connected to the ground;
a resistor having a first end connected to the anode terminal of the Zener diode and a second end connected to the ground;
a plurality of first diodes having anode terminals electrically connected to the wires connected to a plurality of battery cells in which at least a voltage of a plus terminal of the corresponding battery cell is equal to or higher than a predetermined value among the plurality of battery cells and cathode terminals are electrically connected to the cathode terminal of the Zener diode; and
a second diode having an anode terminal connected to the power adjusting unit and a cathode terminal connected to the cathode terminal of the Zener diode, and
wherein the breaker circuit is a fuse having a first end connected to the minus terminal and a second end connected to the voltage detection circuit and the ground.

4. The voltage detection device according to claim 1, further comprising a power adjusting unit that adjusts electric power of the battery and supplies the adjusted electric power as driving power to the voltage detection circuit,
wherein the overvoltage protection circuit includes:
a Zener diode having an anode terminal connected to the ground and in which a current flows when a voltage equal to or higher than the predetermined threshold value is applied thereto;
a plurality of first diodes having anode terminals electrically connected to the wires connected to a plurality of battery cells in which at least a voltage of a plus terminal of the corresponding battery cell is equal to or higher than a predetermined value among the plurality of battery cells and cathode terminals are electrically connected to the cathode terminal of the Zener diode; and
a second diode having an anode terminal connected to the power adjusting unit and a cathode terminal connected to the cathode terminal of the Zener diode, and
wherein the breaker circuit is a fuse having a first end connected to the minus terminal and a second end connected to the voltage detection circuit and the ground.

5. The voltage detection device according to claim 1, further comprising a power adjusting unit that adjusts electric power of the battery and supplies the adjusted electric power as driving power to the voltage detection circuit,
wherein the overvoltage protection circuit includes:
a switching element that includes a first terminal, a second terminal, and a third terminal;
a control means that is connected to the first terminal and turns on the switching element when the voltage of at least one of the wires is higher than the predetermined threshold value;
a plurality of first diodes having anode terminals electrically connected to the wires connected to a plurality of battery cells in which at least a voltage of a plus terminal of the corresponding battery cell is equal to or higher than a predetermined value among the plurality of battery cells and cathode terminals are connected to the second terminal; and a second diode having an anode terminal connected to the power adjusting unit and a cathode terminal connected to the second terminal, wherein the third terminal is electrically connected to the ground; and wherein the breaker circuit is a fuse having a first end connected to the minus terminal and a second end connected to the voltage detection circuit and the ground.

* * * * *